United States Patent
Starkovich et al.

(10) Patent No.: US 10,584,418 B1
(45) Date of Patent: Mar. 10, 2020

(54) PLASMA TREATMENT OF CARBON NANOTUBE SHEET MATERIALS TO REDUCE OPTICAL REFLECTANCE

(71) Applicant: Northrop Grumman Systems Corporation, Falls Church, VA (US)

(72) Inventors: John A. Starkovich, Redondo Beach, CA (US); Edward M. Silverman, Encino, CA (US); Hsiao-Hu Peng, Rancho Palo Verdes, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 15/440,093

(22) Filed: Feb. 23, 2017

(51) Int. Cl.
*C23C 16/50* (2006.01)
*C23C 16/30* (2006.01)
*C23C 16/56* (2006.01)

(52) U.S. Cl.
CPC ............. *C23C 16/50* (2013.01); *C23C 16/30* (2013.01); *C23C 16/56* (2013.01)

(58) Field of Classification Search
CPC ............. C23C 16/50; B05D 5/06; H05H 1/00
See application file for complete search history.

(56) References Cited

U.S. PATENT DOCUMENTS

| | | | | |
|---|---|---|---|---|
| 2008/0170982 A1* | 7/2008 | Zhang | .................... | B82Y 10/00 423/447.3 |
| 2010/0178825 A1* | 7/2010 | Shah | ........................ | D02G 3/16 442/188 |
| 2011/0086464 A1* | 4/2011 | Kim | ........................ | B82Y 30/00 438/82 |
| 2011/0281068 A1 | 11/2011 | David et al. | | |
| 2012/0009381 A1* | 1/2012 | Zhang | .................... | B82Y 30/00 428/118 |
| 2012/0171411 A1* | 7/2012 | Lashmore | ............... | B32B 5/022 428/114 |
| 2012/0263935 A1* | 10/2012 | Ledford | ................... | D02G 3/16 428/293.4 |
| 2012/0282453 A1* | 11/2012 | Wang | ..................... | B29C 70/62 428/299.1 |
| 2012/0312343 A1* | 12/2012 | VanVechten | ............ | H01L 35/22 136/201 |
| 2013/0137324 A1 | 5/2013 | Tang | | |
| 2013/0202866 A1 | 8/2013 | Lee | | |

(Continued)

FOREIGN PATENT DOCUMENTS

JP          2015-86094       *  5/2015

OTHER PUBLICATIONS

Tomlin, N.A., et al., "Decrease in reflectance of vertically-aligned carbon nanotubes after oxygen plasma treatment". Carbon 74 (2014) 329-332.*

(Continued)

*Primary Examiner* — Bret P Chen
(74) *Attorney, Agent, or Firm* — McCracken & Gillen LLC

(57) ABSTRACT

A method for creating a randomly-oriented, non-woven carbon nanotube (CNT) sheet with reduced reflectance includes: providing a randomly-oriented, non-woven CNT sheet; and performing plasma treatment of the randomly-oriented, non-woven CNT sheet, thereby creating a randomly-oriented, non-woven CNT sheet with reduced reflectance.

14 Claims, 5 Drawing Sheets

(56) References Cited

U.S. PATENT DOCUMENTS

| | | | | |
|---|---|---|---|---|
| 2014/0183158 | A1* | 7/2014 | Chao | G06F 3/044 |
| | | | | 216/13 |
| 2014/0332673 | A1* | 11/2014 | Lehman | G01J 1/56 |
| | | | | 250/216 |
| 2016/0236938 | A1* | 8/2016 | Johnson | C01B 32/168 |
| 2016/0353724 | A1* | 12/2016 | Miller | A01K 87/00 |
| 2017/0029275 | A1* | 2/2017 | Starkovich | H01J 37/32009 |
| 2017/0031037 | A1* | 2/2017 | MacLaughlin | G01T 1/2018 |

OTHER PUBLICATIONS

Cho, Sang-Jin, et al., "Electrical Characteristics of Carbon Nanotubes by Plasma and Microwave Surface Treatments". Bull. Korean Chem. Soc. 2014, vol. 35, No. 3, pp. 905-907.*

Ritts, Andrew C., et al., "Plasma Treated Multi-Walled Carbon Nanotubes (MWCNTs) for Epoxy Nanocomposites". Polymers 2011, 3, 2142-2155.*

Malik, Rachit, et al., "Manufacturing and Applications of Carbon Nanotube Sheet". Recent Advances in Circuits, Communications and Signal Processing, p. 327-335. No date or further details available.*

Tomlin, N. A. et al; Decrease in reflectance of vertically-aligned carbon nanotubes after oxygen plasma treatment; Carbon 74 (2014); pp. 329-332; Elsevier Ltd.

Aria, A.I. et al; Morphology engineering of hollow carbon nanotube pillars by oxygen plasma treatment; Carbon 81 (2015); pp. 376-387.

Krivchenko, V. A. et al; Carbon nanowalls: the next step for physical manifestation of the black body coating; Scientific reports; 3:3328; 2013; DOI: 10.1038/srep03328; pp. 1-6.

Sun, Y. et al; Bendable, ultra-black absorber based on a graphite nanocone nanowire composite structure; Optics express vol. 23, No. 15 (2015): DOI:10.1364/OE.23.020115; pp. 20115 thru 20123.

Lepcha, A. et al; Electrospun Black Titania Nanofibers: Influence of Hydrogen Plasma-Induced Disorder on the Electronic Structure and Photoelectrochemical Performance; The Journal of Physical Chemistry C 2015, 119, No. 33 (2015); pp. 18835-18842; DOI: 10.1021/scs.jpcc.5b02767.

C.J. Chunnilal, et al., Infrared hemispherical reflectance of carbon nanotube mats and arrays in the 5-50 μm wavelength region, Carbon 50, (2012), 5348-5350.

De Heer et al., "Aligned Carbon Nanotube Films: Production and Optical and Electronic Properties," Science, vol. 268, May 12, 1995; pp. 845-847.

* cited by examiner 0 min — 1μ

0.5 min — 1μ

1 min — 1μ

2 min — 1μ

5 min — 1μ

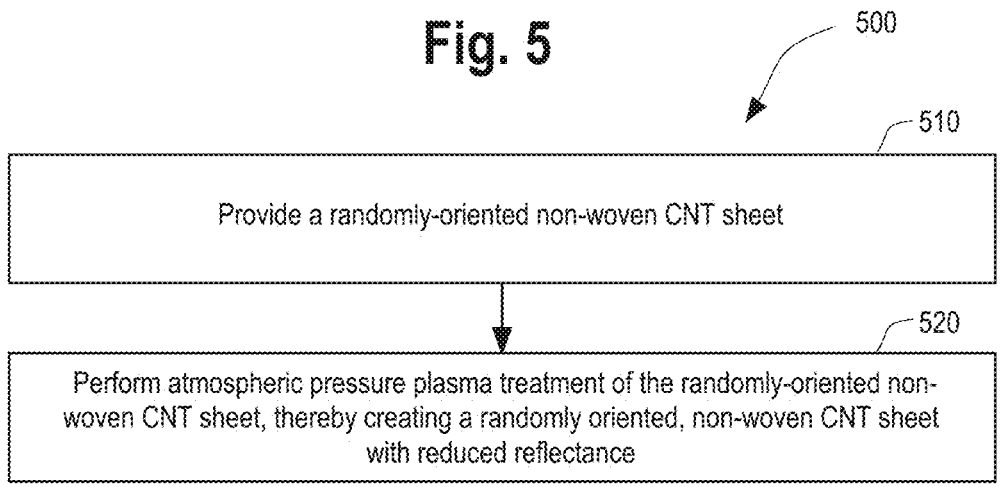
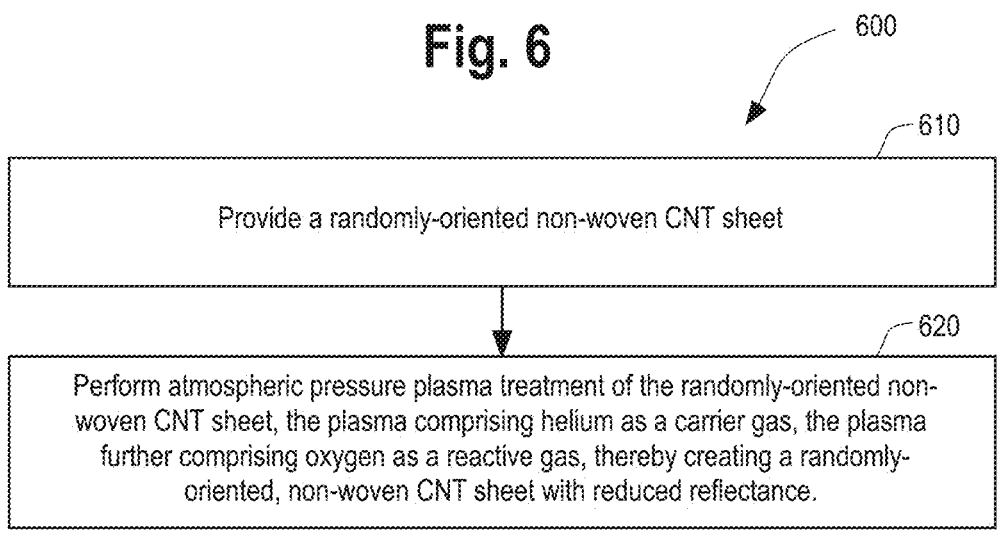

PLASMA TREATMENT OF CARBON NANOTUBE SHEET MATERIALS TO REDUCE OPTICAL REFLECTANCE

STATEMENT OF GOVERNMENT RIGHTS

The Government of the United States of America has rights in this invention pursuant to Government Contract No. 11-C-0042.

SUMMARY

A method for creating a randomly-oriented, non-woven carbon nanotube (CNT) sheet with reduced reflectance includes: providing a randomly-oriented, non-woven CNT sheet; and performing plasma treatment of the randomly-oriented, non-woven CNT sheet, thereby creating a randomly-oriented, non-woven CNT sheet with reduced reflectance.

A method for creating a randomly-oriented, non-woven carbon nanotube (CNT) sheet with reduced reflectance includes: providing a randomly-oriented, non-woven CNT sheet; and performing plasma treatment of the randomly-oriented, non-woven CNT sheet, the plasma comprising helium as a carrier gas, the plasma further comprising oxygen as a reactive gas, thereby creating a randomly-oriented, non-woven CNT sheet with reduced reflectance.

DESCRIPTION OF THE DRAWINGS

The accompanying drawings provide visual representations which will be used to more fully describe various representative embodiments and can be used by those skilled in the art to better understand the representative embodiments disclosed herein and their advantages. In these drawings, like reference numerals identify corresponding elements.

FIG. 5 is a flowchart of a method 500 for manufacturing a randomly-oriented, non-woven carbon nanotube sheet with reduced reflectance.

FIG. 6 is a flowchart of a method 600 for manufacturing a randomly-oriented, non-woven carbon nanotube (CNT) sheet with reduced reflectance.

DETAILED DESCRIPTION

Figure 1A:
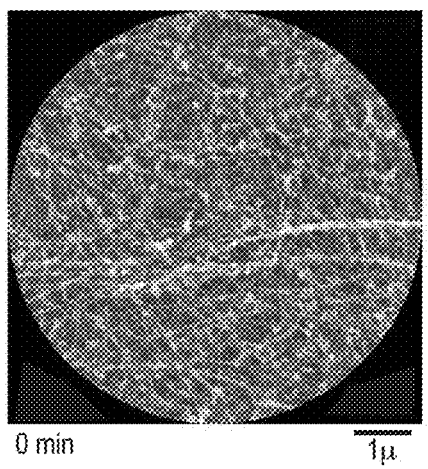
FIGS. 1A-1E are a set of five scanning electron photomicrographs of atmospheric pressure plasma treatment using both helium and oxygen of a randomly-oriented, non-woven CNT sheet.

While the present invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described. In the following description and in the several figures of the drawings, like reference numerals are used to describe the same, similar or corresponding parts in the several views of the drawings.

According to embodiments of the invention, a method is provided for creating a carbon nanotube (CNT) sheet with reduced reflectance. According to other embodiments of the invention, a method is provided for substantially reducing the reflectance of a randomly-oriented, non-woven CNT sheet.

Alternatively, or additionally, a method is provided for creating a CNT sheet with reduced reflectance properties.

FIGS. 1A-1E are a set of five scanning electron photomicrographs of atmospheric pressure plasma treatment of a randomly-oriented, non-woven CNT sheet. FIGS. 1A-1E show examples using atmospheric pressure from both helium and oxygen. FIGS. 1A-1E illustrate exposure of a plasma at approximately 180 watts of power, with approximately 30 liters per minute (L/min) of helium and with approximately 0.75 L/min of oxygen. The distance is approximately 3 millimeters. The instrument used to generate the data illustrated in FIGS. 1A-1E is a SurfX Atomflo 500 using a two-inch linear nozzle, manufactured by SurfX Technologies of Redondo Beach, Calif. (www.surfxtechnologies.com).

Figure 1B:
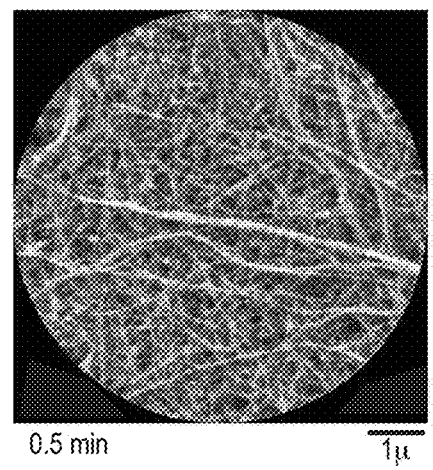
Figure 1C:
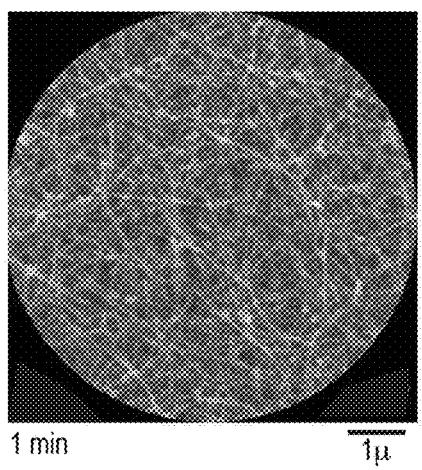
Figure 1D:
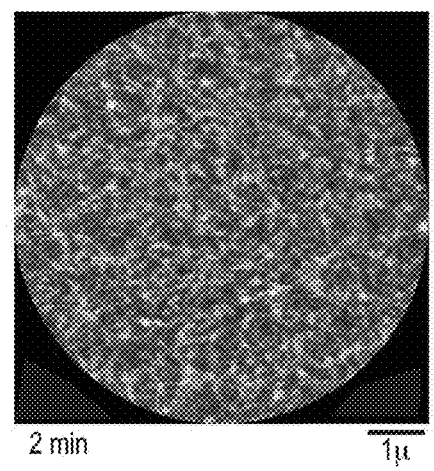
Figure 1E:
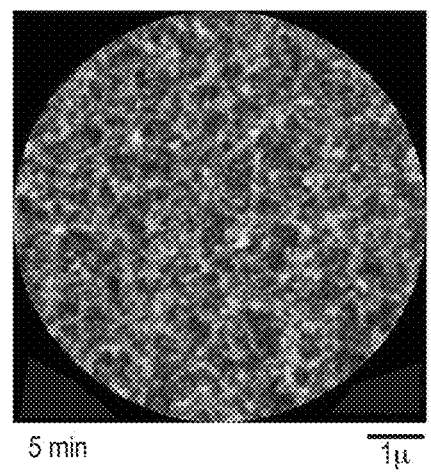

FIG. 1A is a scanning electron photomicrograph of a sheet about to undergo treatment, so at the 0 minute exposure. FIG. 1B is a scanning electron photomicrograph of a sheet after a treatment time of 0.5 minutes. FIG. 1C is a scanning electron photomicrograph of a sheet after a treatment time of 1 minute. FIG. 1D is a scanning electron photomicrograph of a sheet after a treatment time of 2 minutes. FIG. 1E is a scanning electron photomicrograph of a sheet after a treatment time of 5 minutes. Taken together, FIGS. 1A-1E illustrate the evolution of surface texture and surface morphology with varying exposure times for atmospheric pressure plasma treatment using one or more of helium and oxygen of the randomly-oriented, non-woven CNT sheet.

FIGS. 2A-2D are a set of four graphs of hemispherical reflectance against wavelength for atmospheric pressure plasma treatment of a randomly-oriented, non-woven CNT sheet. FIGS. 2A-2D show examples using atmospheric pressure from both helium and oxygen. FIGS. 2A-2D illustrate exposure of a plasma at approximately 180 watts of power, with approximately 30 L/min of helium and with approximately 0.75 L/min of oxygen. The distance is approximately 3 millimeters. The instrument used to generate the data illustrated in FIGS. 2A-2D is a SurfX Atomflo 500 using a two-inch linear nozzle, manufactured by SurfX Technologies of Redondo Beach, Calif. (www.surfxtechnologies.com).

Figure 2A:
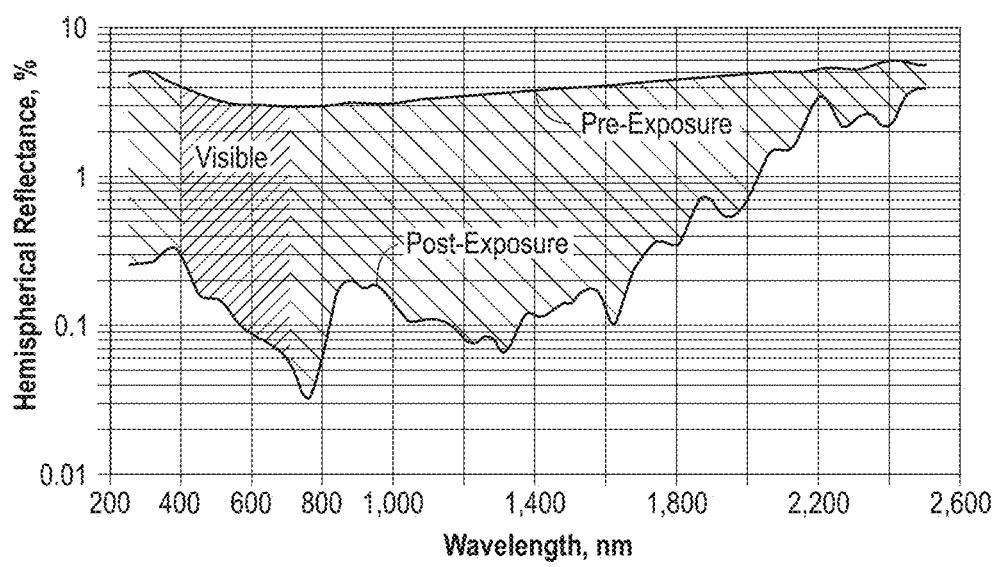
FIGS. 2A-2D are a set of four graphs of hemispherical reflectance against wavelength for atmospheric pressure plasma treatment using both helium and oxygen of a randomly-oriented, non-woven CNT sheet.
Figure 2B:
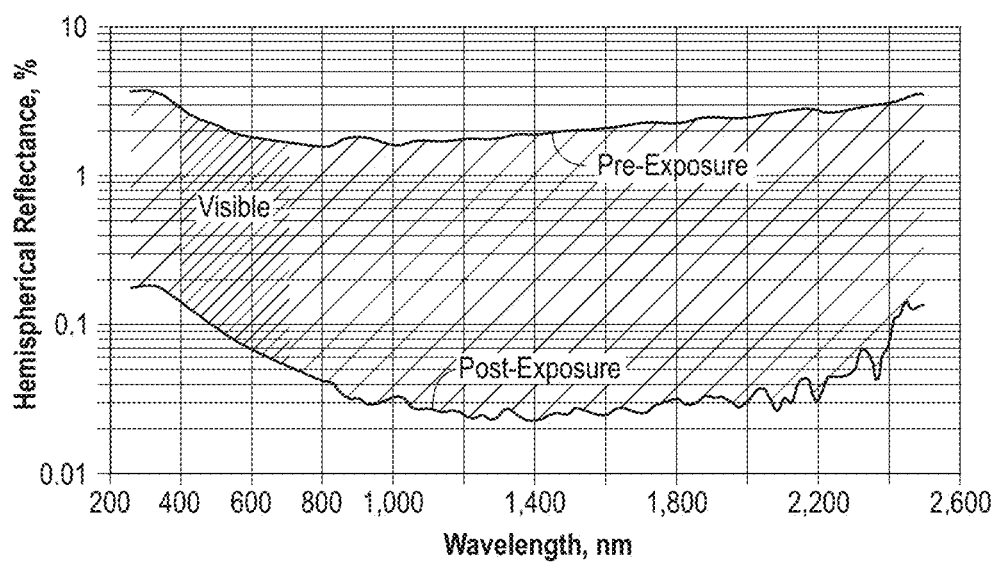
Figure 2C:
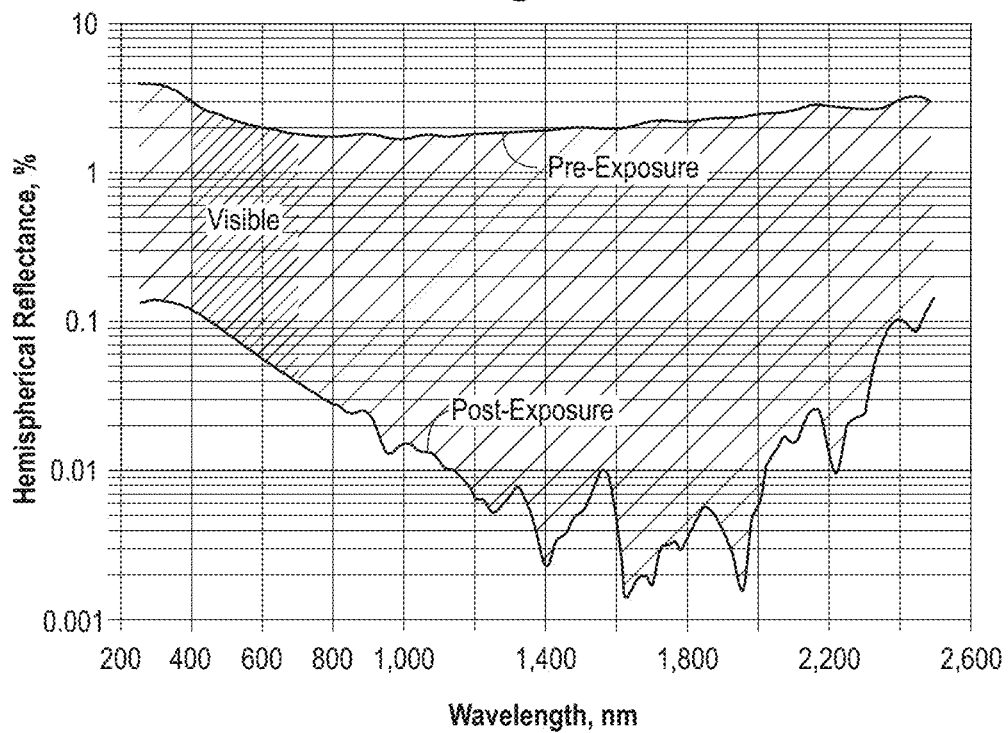
Figure 2D:
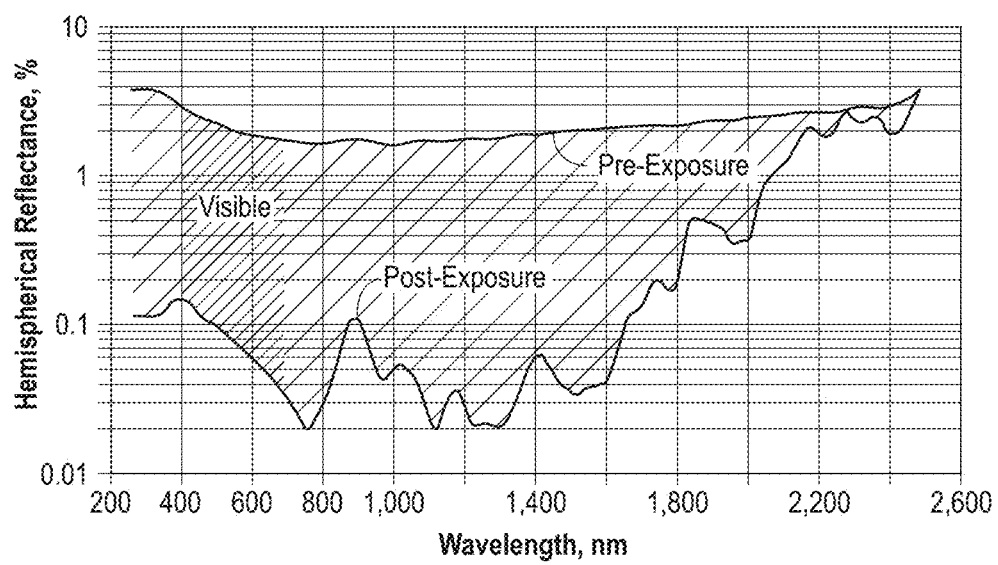

FIG. 2A is a graph of hemispherical reflectance against wavelength after a treatment time of 0.5 minutes. FIG. 2B is a graph of hemispherical reflectance against wavelength after a treatment time of 1 minute. FIG. 2C is a graph of hemispherical reflectance against wavelength after a treatment time of 2 minutes. FIG. 2D is a graph of hemispherical reflectance against wavelength after a treatment time of 5 minutes. For example, a reflectance of less than approximately 0.1% can be seen for the wavelength region from approximately 250 nanometers to approximately 1,600 nanometers (250 nm-1600 nm). Taken together, FIGS. 2A-2D illustrate the evolution of reflectance with varying exposure times for atmospheric pressure plasma treatment using one or more of helium and oxygen of the randomly-oriented, non-woven CNT sheet. The large reduction seen in reflectances at the higher exposure times may be attributed to a combination effect of an increase in material chemically-bonded oxygen content (material functionalization) and an increase in surface porosity. The increase in surface porosity creates a sheet with a more effective photon trapping pore structure and one or more of a lowered refractive index and a closer match of refractive indices at an air-surface interface.

Figure 3:
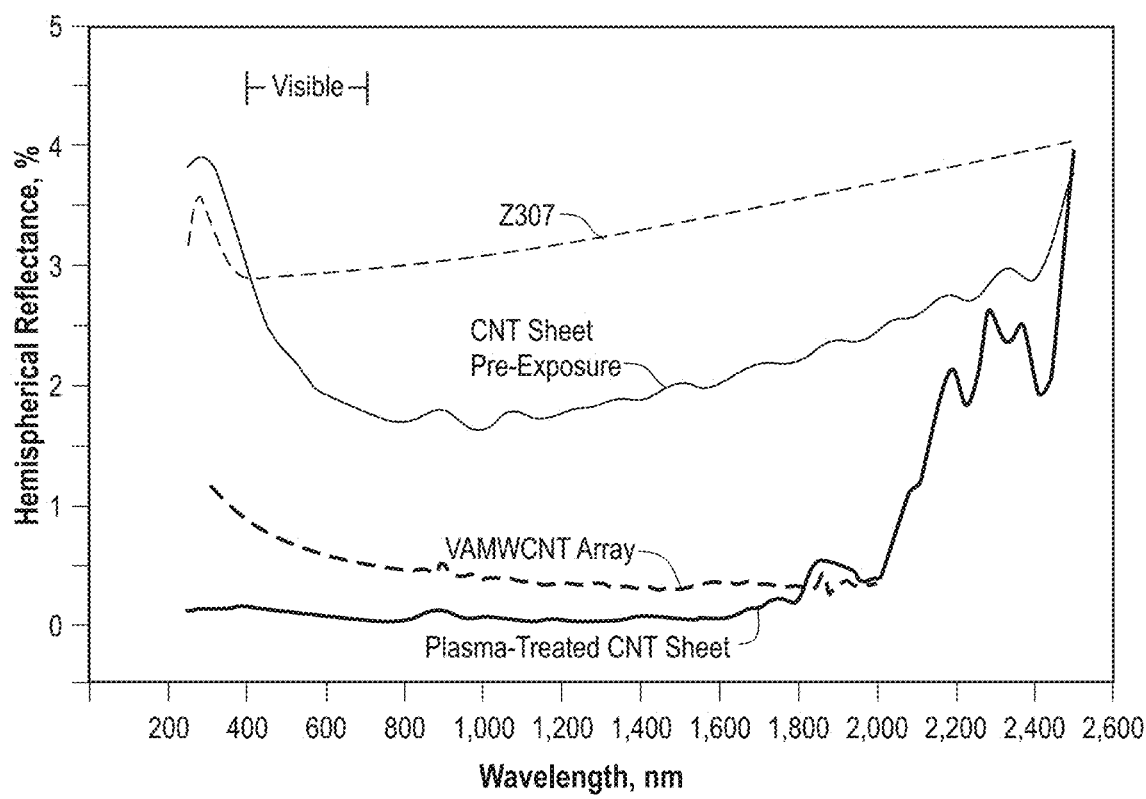
FIG. 3 is a graph of hemispherical reflectance against wavelength for atmospheric pressure plasma treatment using both helium and oxygen of a randomly-oriented, non-woven CNT sheet and for three prior art sheets.

FIG. 3 is a graph of hemispherical reflectance against wavelength for atmospheric pressure plasma treatment of a randomly-oriented, non-woven CNT sheet and for three prior art specimens. FIG. 3 shows an example using atmospheric pressure from both helium and oxygen. One depicted prior art black coating is an industry standard using Aeroglaze Z307 polyurethane coating, manufactured by Lord Corporation of Cary, N.C. (www.lord.com). A second depicted prior art sheet is nonwoven CNT sheet prior to atmospheric pressure plasma treatment. A third depicted prior art material is a vertically aligned multi-walled carbon nanotube (VAMWCNT) array.

The results illustrated the superior performance of embodiments of the invention relative to prior art. Substantial reflectance reduction is achieved by atmospheric pressure plasma treatment using one or more of helium and oxygen of the randomly-oriented, non-woven CNT sheet. Accordingly, embodiments of the invention are extremely competitive, in fact 1-2 orders of magnitude better, for applications requiring reduction of stray light with optical black coating and vertical aligned (VACNT) arrays.

Figure 4:
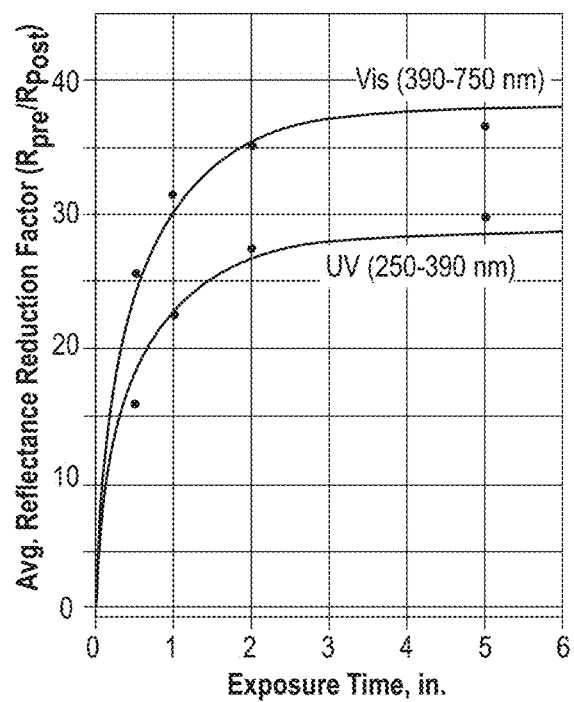
FIG. 4 is a graph of an average reflectance reduction factor $R_{pre}/R_{post}$ against exposure time for different spectral bands for atmospheric pressure plasma treatment using both helium and oxygen of a randomly-oriented, non-woven CNT sheet.

FIG. 4 is a graph of an average reflectance reduction factor $R_{pre}/R_{post}$ against exposure time for different spectral bands for atmospheric pressure plasma treatment using both helium and oxygen of a randomly-oriented, non-woven CNT sheet. $R_{pre}$ is the reflectance prior to treatment and $R_{post}$ is the reflectance after treatment. The results show a plateau effect for an exposure time greater than approximately two minutes.

The results illustrate the superior performance of embodiments of the invention relative to the prior art. Substantial reflectance reduction is achieved by atmospheric pressure plasma treatment using a helium-oxygen plasma on the randomly-oriented, non-woven CNT sheet. Accordingly, embodiments of the invention are extremely competitive, in fact 1-2 orders of magnitude better, for applications requiring reduction of stray light with optical black coatings and VACNT arrays. The substantial reflectance reductions illustrated in FIGS. 2 through 4 were achieved through treatment of CNT sheet surfaces using a helium-oxygen plasma operating at ambient pressure and temperature conditions.

FIG. 5 is a flowchart of a method 500 for manufacturing a randomly-oriented, non-woven carbon nanotube (CNT) sheet with reduced reflectance.

In step 510, a randomly-oriented, non-woven CNT sheet is provided. Block 510 then transfers control to block 520.

In step 520, atmospheric pressure plasma treatment of the randomly-oriented, non-woven CNT sheet is performed, thereby creating a partially oxidized, randomly-oriented, non-woven CNT sheet with reduced reflectance. For example, atmospheric pressure plasma treatment of the sheet is performed. For example, plasma treatment of the sheet other than atmospheric pressure plasma treatment is performed. Block 520 then terminates this process.

For example, the performing step comprises creating a sheet with one or more of a lowered refractive index and a closer match of refractive indices at an air-surface interface.

For example, the performing step comprises creating a randomly-oriented, non-woven CNT sheet with reduced reflectance by performing one or more of increasing material chemically-bonded oxygen content and increasing surface porosity.

According to further embodiments of the invention, other reactive plasmas operating at different temperature and pressure conditions can be used. For example, the plasma is capable of one or more of attacking carbon, reacting with carbon, and gasifying the CNT. For example, the plasma is capable of one or more of splitting, unzipping, and expanding a tubular structure of the CNT.

For example, the plasma comprises a carrier gas. For example, the plasma further comprises a reactive gas. For example, the carrier gas comprises one or more of helium, neon, argon, krypton, xenon, and nitrogen. For example, the reactive gas comprises one or more of oxygen, ammonia, chlorine, chlorocarbons, fluorine, fluorocarbons, chlorofluorocarbons, hydrogen, nitrous oxide, nitric oxide, ozone, sulfur hexafluoride, silicon hexafluoride, and water vapor.

For example, the plasma comprises a non-atmospheric pressure plasma. For example, the non-atmospheric plasma comprises one or more of a plasma at super-ambient pressure, a plasma at sub-ambient pressure and a vacuum plasma.

FIG. 6 is a flowchart of a method 600 for manufacturing a randomly-oriented, non-woven carbon nanotube (CNT) sheet with reduced reflectance.

In step 610, a randomly-oriented, non-woven CNT sheet is provided. Block 610 then transfers control to block 620.

In step 620, plasma treatment of the randomly-oriented, non-woven CNT sheet is performed, the plasma comprising helium as a carrier gas, the plasma further comprising oxygen as a reactive gas, thereby creating a partially oxidized, randomly-oriented, non-woven CNT sheet with reduced reflectance. For example, atmospheric pressure plasma treatment of the sheet is performed. For example, plasma treatment of the sheet other than atmospheric pressure plasma treatment is performed. Block 620 then terminates this process.

Embodiments of the invention provide numerous benefits. Embodiments of the invention provide a randomly-oriented, non-woven CNT sheet having a substantially reduced reflectance properties while substantially maintaining one or more of pre-plasma treatment strength and flexibility of an as-produced sheet. Accordingly, embodiments of the invention provide a randomly-oriented, non-woven CNT sheet having superior reflectance relative to prior art optical black coatings for stray light reduction systems, bolometric sensors and thermal radiation emitters. Embodiments of the invention provide a randomly-oriented, non-woven sheet that is freestanding. Embodiments of the invention provide a randomly-oriented, non-woven that sheet configured to be used one or more of by itself, mechanically fastened to a surface, and adhesively bonded to a surface.

Other embodiments of the invention provide a randomly-oriented, non-woven sheet that can be handled. Further embodiments of the invention provide a randomly-oriented, non-woven sheet that is configured to be one or more of attached to a flat surface and molded onto a curved surface. In this respect, embodiments of the invention sharply contrast with prior art vertically-aligned CNT arrays that are plasma-treated to remove amorphous carbon from the surface, producing a product that is very fragile and delicate to handle.

Embodiments of the invention are also much less expensive, approximately 2% of the cost of the prior art, as they do not require growth of vertically-aligned arrays in a vacuum chamber. An additional advantage is that embodiments of the invention can be produced in sheets having dimensions, for example, of approximately four feet by approximately eight feet (approximately 1.2 meters by approximately 2.4 meters). For example, the randomly-oriented, non-woven sheet has an area of greater than approximately 10 square meters (10 m$^2$). For example, the randomly-oriented, non-woven CNT sheet with reduced reflectance has dimensions of approximately four feet by approximately eight feet.

That is, embodiments of the invention are not limited in size to dimensions of approximately four inches by four inches as is the case with the size of the vacuum chamber in which the prior art vertically-aligned arrays are grown.

An additional advantage of embodiments of the invention is that the randomly-oriented, non-woven CNT sheet is producible as a thin sheet. For example, the randomly-oriented, non-woven sheet has a thickness of between approximately 10 microns and approximately 500 microns (10-500 µm). An additional advantage of embodiments of the invention is that the randomly-oriented, non-woven CNT sheet has a tensile strength of greater than approximately 65,000 pounds per square inch (PSI) (450 kPa).

A still further advantage of embodiments of the invention is that the randomly-oriented, non-woven CNT sheet is mechanically robust. The randomly-oriented, non-woven CNT sheet are configured to be applied to one or more of a flat surface, a curved surface, and a sharp-edged surface without substantial tearing.

A further advantage of embodiments of the invention is that plasma treatment under atmospheric pressure using one or more of helium and oxygen of a randomly-oriented, non-woven CNT sheet reduces their reflectance to levels below those of traditional optical black paints and inorganic coatings and nearly matching those of highly performing but fragile vertically aligned CNT (VACNT) arrays.

A still further advantage of embodiments of the invention is that VACNT arrays are producible only on a limited size scale by vacuum chemical vapor deposition/growth techniques and are extremely fragile unless infused with polymer resin. Resin infusion is tricky to accomplish and significantly increases their reflectance. Resin infusion is unnecessary with embodiments of the invention.

It will be further understood by those of skill in the art that the number of variations of the invention and the like are virtually limitless. It is intended, therefore, that the subject matter in the above description shall be interpreted as illustrative and shall not be interpreted in a limiting sense.

While the above representative embodiments have been described with certain components in exemplary configurations, it will be understood by one of ordinary skill in the art that other representative embodiments can be implemented using different configurations and/or different components. For example, it will be understood by one of ordinary skill in the art that the order of certain steps and certain components can be altered without substantially impairing the functioning of the invention.

The representative embodiments and disclosed subject matter, which have been described in detail herein, have been presented by way of example and illustration and not by way of limitation. It will be understood by those skilled in the art that various changes may be made in the form and details of the described embodiments resulting in equivalent embodiments that remain within the scope of the invention.

It is intended, therefore, that the subject matter in the above description shall be interpreted as illustrative and shall not be interpreted in a limiting sense.

We claim:

1. A method for creating a randomly-oriented, non-woven carbon nanotube (CNT) sheet with reduced reflectance, comprising:
   providing a randomly-oriented, non-woven CNT sheet configured to be applied to flat surfaces without substantial tearing; and
   using a plasma, performing plasma treatment of the randomly-oriented, non-woven CNT sheet, thereby creating a randomly-oriented, non-woven CNT sheet with reduced reflectance, wherein the randomly-oriented, non-woven CNT sheet with reduced reflectance has a reflectance after the performing step of approximately 0.1% at a wavelength of between approximately 250 nanometers and approximately 1600 nanometers (250 nm-1600 nm).

2. The method of claim 1, wherein the plasma comprises a carrier gas, the plasma further comprising a reactive gas.

3. The method of claim 2, wherein the carrier gas comprises one or more of helium, neon, argon, krypton, xenon, and nitrogen.

4. The method of claim 2, wherein the reactive gas comprises one or more of oxygen, ammonia, chlorine, chlorocarbons, fluorine, fluorocarbons, chlorofluorocarbons, hydrogen, nitrous oxide, nitric oxide, ozone, sulfur hexafluoride, silicon hexafluoride, and water vapor.

5. The method of claim 1, wherein the plasma comprises a non-atmospheric pressure plasma.

6. The method of claim 1, wherein the performing step comprises creating a sheet with one or more of a lowered refractive index and a closer match of refractive indices at an air-surface interface.

7. The method of claim 1, further comprising an additional step of creating a randomly-oriented, non-woven CNT sheet with reduced reflectance by one or more of increasing material chemically-bonded oxygen content and increasing surface porosity.

8. The method of claim 1, wherein the randomly-oriented, non-woven CNT sheet with reduced reflectance is freestanding.

9. The method of claim 1, wherein the randomly-oriented, non-woven CNT sheet with reduced reflectance is configured to be one or more of attached to a flat surface and molded onto a curved surface.

10. The method of claim 1, wherein the randomly-oriented, non-woven CNT sheet with reduced reflectance has an area of greater than approximately 10 square meters.

11. The method of claim 1, wherein the randomly-oriented, non-woven CNT sheet with reduced reflectance has dimensions of approximately four feet by approximately eight feet.

12. The method of claim 1, wherein the randomly-oriented, non-woven CNT sheet with reduced reflectance has a thickness of between approximately 10 microns and approximately 500 microns.

13. The method of claim 1, wherein the randomly-oriented, non-woven CNT sheet has a tensile strength of at least approximately 65,000 pounds per square inch.

14. The method of claim 1, wherein the plasma comprises an atmospheric pressure plasma.

* * * * *